(12) United States Patent
Krajec et al.

(10) Patent No.: US 6,513,260 B2
(45) Date of Patent: Feb. 4, 2003

(54) CUSTOMIZABLE NEST FOR POSITIONING A DEVICE UNDER TEST

(75) Inventors: Russell Steven Krajec, Berthoud, CO (US); John L Bidwell, Ft. Collins, CO (US); William R Miner, Johnstown, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/029,254

(22) Filed: Dec. 21, 2001

(65) Prior Publication Data

US 2002/0053145 A1 May 9, 2002

Related U.S. Application Data

(62) Division of application No. 09/483,769, filed on Jan. 18, 2000, now Pat. No. 6,336,276.

(51) Int. Cl.[7] .................. B23Q 1/25; B23Q 3/00; A47B 97/02; G01D 21/00
(52) U.S. Cl. ................... 33/645; 248/346.06; 269/902; 269/296
(58) Field of Search .................. 33/645, 568, 573, 33/613, 549; 269/902, 296; 248/346.06

(56) References Cited

U.S. PATENT DOCUMENTS

| | | |
|---|---|---|
| 3,156,984 A | 11/1964 | Palmer |
| 3,537,697 A | 11/1970 | Davis |
| 4,270,426 A * | 6/1981 | Raphael ............... 83/411 R |
| 4,398,349 A * | 8/1983 | Bailey ............... 33/174 TA |
| 4,429,862 A | 2/1984 | Niedecker |
| 4,480,364 A | 11/1984 | Kosmowski |
| 4,593,804 A | 6/1986 | Kinsey et al. |
| 4,686,769 A | 8/1987 | Rock et al. |
| 4,799,659 A | 1/1989 | Donovan |
| 4,939,454 A | 7/1990 | Miner |
| 4,961,050 A | 10/1990 | Harwood et al. |
| 5,005,814 A | 4/1991 | Gumbert |
| 5,064,321 A | 11/1991 | Barnes |
| 5,107,599 A | 4/1992 | Marincic et al. |
| 5,275,326 A | 1/1994 | Fiedler |
| 5,300,881 A | 4/1994 | Ferrer et al. |
| 5,321,351 A | 6/1994 | Swart et al. |
| 5,408,189 A | 4/1995 | Swart et al. |
| 5,416,405 A | 5/1995 | Dill |
| 5,436,567 A | 7/1995 | Wexler et al. |
| 5,492,223 A | 2/1996 | Boardman et al. |
| 5,505,438 A | 4/1996 | Baldwin et al. |
| 5,572,144 A | 11/1996 | Davidson et al. |
| 5,666,737 A | 9/1997 | Ryan, III |
| 5,672,034 A | 9/1997 | McLean |
| 5,715,167 A | 2/1998 | Gupta et al. |
| 5,829,152 A | 11/1998 | Potter et al. |
| 5,853,270 A | 12/1998 | Salley et al. |
| 5,884,885 A * | 3/1999 | Schmidt, Jr. ............ 248/346.01 |
| 6,105,949 A | 8/2000 | Morghen |
| 6,212,787 B1 | 4/2001 | Dixon |
| 6,279,888 B1 * | 8/2001 | Wal, III ............... 269/37 |
| 6,286,823 B1 * | 9/2001 | Morghen ............... 269/47 |
| 6,286,824 B1 * | 9/2001 | Sagol ............... 269/99 |
| 6,298,572 B1 * | 10/2001 | McAuley ............... 33/573 |

* cited by examiner

*Primary Examiner*—Diego Gutierrez
*Assistant Examiner*—Gail Verbitsky (57) ABSTRACT

A customizable nest plate for securely positioning a device to be nested. An alignment device may be used to position nest pins within one version of the nest plate. In another version, several tugboat stop blocks may be adjusted and secured against a nest plate having many threaded apertures in order to secure the device to be nested. In addition, adjustable ramps may be used to adjust the height of a device to be nested above the surface of the nest plate.

11 Claims, 8 Drawing Sheets

CUSTOMIZABLE NEST FOR POSITIONING A DEVICE UNDER TEST

CROSS REFERENCE TO RELATED APPLICATION(S)

This is a divisional of application Ser. No. 09/483,769 filed on Jan. 18, 2000, now U.S. Pat. No. 6,336,276 B1.

REFERENCE TO RELATED APPLICATION

The present application is related to United States patent application of Russell S. Krajec, entitled "Adjustable Electrical Connector for Test Fixture Nest, and filed Nov. 17, 1999; and United States patent application of Russell S. Krajec and Wallace J. Lannen, entitled "Signal Transfer Device for Probe Test Fixture," and filed Nov. 17, 1999, both of which are incorporated herein by reference as if fully set forth.

FIELD OF THE INVENTION

The present invention relates to a customizable nest plate for use in positioning and securely holding a device under test.

BACKGROUND OF THE INVENTION

Certain devices are more easily tested and worked on while held securely in position. For example, when performing maintenance on cellular phones, a person may more easily work with the phone if it is held securely in position. In addition, holding the device under test in position serves to protect it from potential damage while being worked on. For certain applications, a nest plate may be custom-made for a particular device under test. In order to customize a nest plate, the device under test is measured and appropriate configuration and machining is made of the nest plate to accommodate the device under test, along with a mechanism to hold it in place such as nest pins located in predetermined locations. In addition, certain devices require that they be elevated above a nest plate. Therefore, a nest plate must sometimes include a custom-made mechanism for elevating a device under test above the nest plate.

Accordingly, a need exists for an improved method of customizing a nest plate and other mechanisms for accommodating a device under test while positioned on a nest plate.

SUMMARY OF THE INVENTION

An adjustable stop block consistent with the present invention is used for nesting a device under test. It includes a base for placement against a nest plate having a plurality of nest apertures. The base defines an elongated aperture for use in adjustably securing the base to the nest plate using a fastener positioned in the elongated aperture and connected to one of the nest apertures. The adjustable stop block also includes a vertical portion having first and second ends. The first end of the vertical portion is connected to the base and the second end of the vertical portion extends away from the nest plate when the base is secured to the one nest aperture. When in use to nest the device under test, the vertical portion contacts the device.

A ramp consistent with the present invention is used for elevating a device under test above a nest plate. The ramp includes a base for placement against a nest plate having a plurality of nest apertures, and the base defines an elongated aperture for use in adjustably securing the base to the nest plate using a fastener positioned in the elongated aperture and connected to one of the nest apertures. A vertical portion is connected to the base and includes a variable portion for contacting the device under test and elevating the device under test above the nest plate. The ramp optionally includes an adjustment portion for joining together two of the ramps and adjusting a distance between the variable portions of the two ramps for use in adjusting the height of the device under test above the nest plate.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Customizable Nest With an Alignment Device

Figure 1:
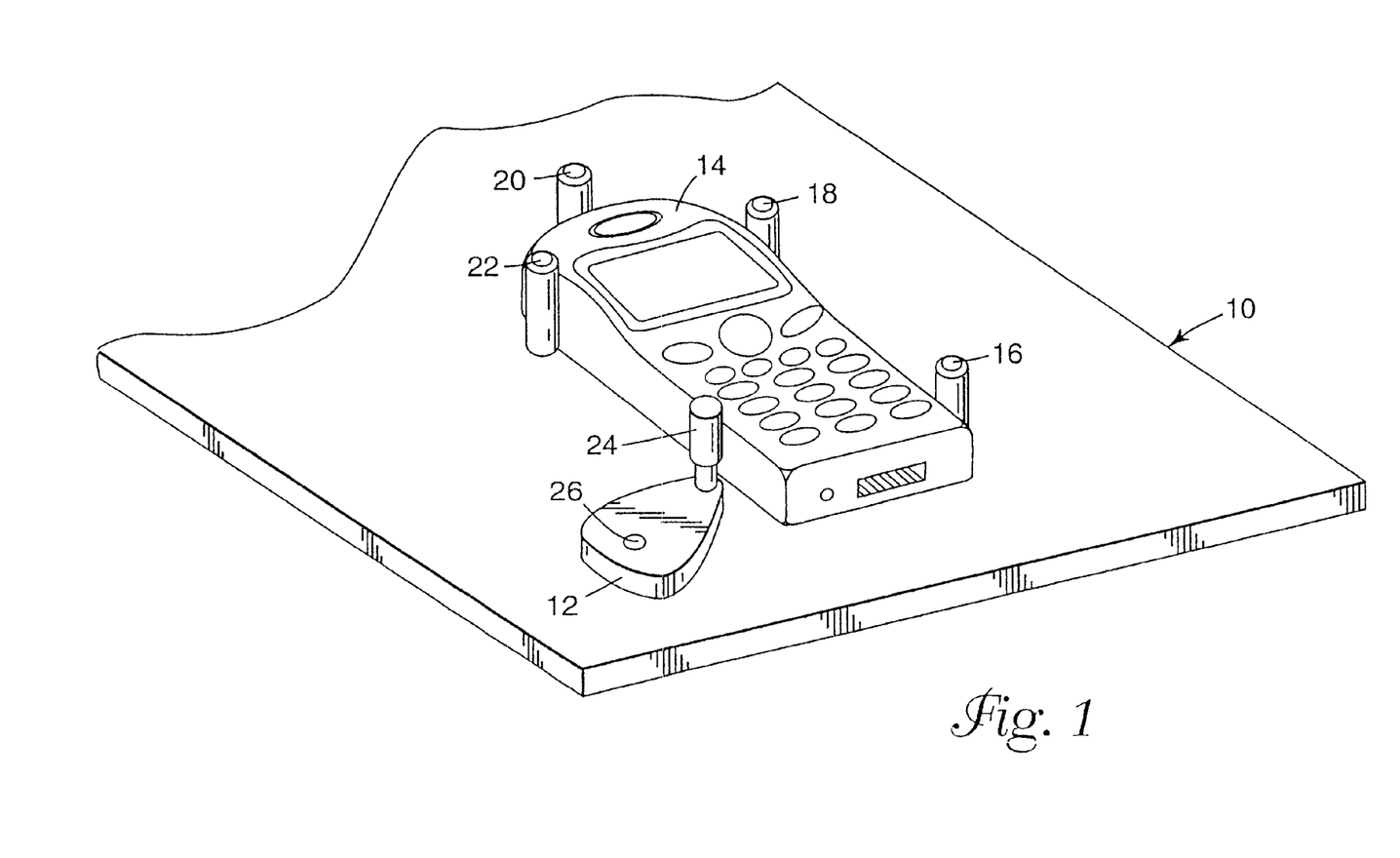
FIG. 1 is a perspective diagram of use of an alignment device for customizing a nest plate.

FIG. 1 is a perspective diagram of a customizable nest plate using an alignment device. Nest plate 10 includes a plurality of nest pins 16, 18, 20, and 22 for holding in position a device under test 14. A telephone is shown as device under test 14 for illustrative purposes only; any type of device may be used for device under test 14. An alignment device 12 is used to position and add nest pins 16, 18, 20, and 22 to nest plate 10, as well as any additional nest pins required or used to hold device 14 in position on nest plate 10. Nest plate 10 is typically made from a non-conductive material such as plastic or fiberglass; alternatively, it may be made from other types of material such as aluminum.

Figure 2:
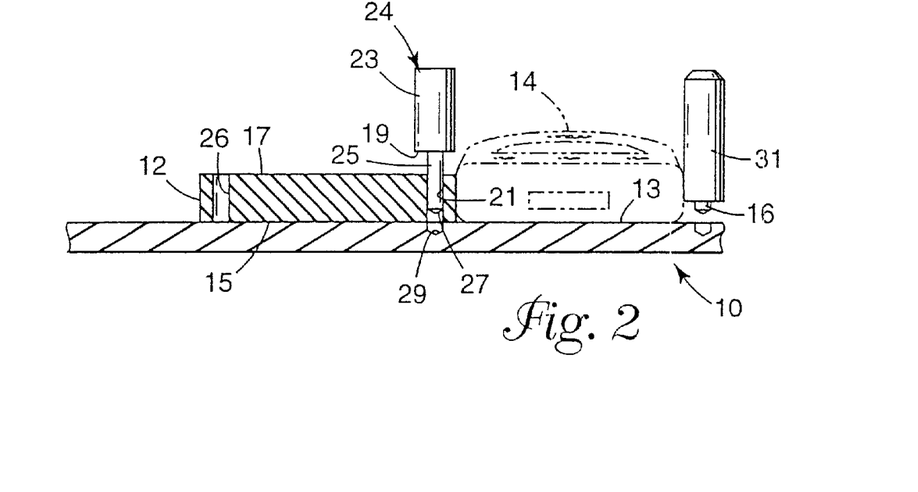
FIG. 2 is a side view of use of an alignment device for customizing a nest plate.

FIG. 2 illustrates use of alignment device 12 to add a nest pin to nest plate 10. As shown, nest pin 16 is already in place within nest plate 10. An additional nest pin is to be added to nest plate 10 in order to help secure device 14 in position. Alignment device 12 includes a transfer punch 24 having a top portion 23 and a shank 25. One end of shank 25 includes a point 27 for marking a position on nest plate 10. Alignment device 12 also has a guide hole 21 for accommodating transfer punch 24. Shank 25 typically has a diameter substantially equal to, or slightly less than, a diameter of guide hole 21 such that shank 25 has little, if any, room for lateral movement in order to increase the accuracy of creating a punch mark using transfer punch 24. The use of alignment device 12 for customizing a nest is further explained with reference to FIGS. 2, 3A, and 3B, and a method 32 shown in the flow chart in FIG. 4.

Device 14 to be nested is first placed on nest plate 10 in a position where it is intended to be held (step 34). As shown in FIG. 2, device 14 is placed against nest pin 16 already installed on nest plate 10 and alignment device 12 is used to install another nest pin on nest plate 10. If this were the first nest pin to be installed, device 14 would be placed on nest plate 10 positioned where it is intended to be held, as stated in step 34. Alignment device 12, with a bottom surface 15 placed on a top surface 13 of nest plate 10, is positioned next to device 14 with top portion 23 of transfer punch 24 or side of alignment device 12 contacting device 14 (step 36). For use in aligning the device, top portion 23 of transfer punch 24 typically has an outer surface on a same vertical plane as a corresponding outer surface of alignment device 12 when transfer punch 24 is positioned in guide hole 21. Either top portion 23 or the side of alignment device 12, as shown, may be placed against or proximate device 14 for positioning, depending upon a height of device 14.

The top of transfer punch 24 is tapped with a hammer to mark a position of a nest pin (step 38). By tapping the top of transfer punch 24, point 27 on shank 25 strikes top surface 13 of nest plate 10 creating a punch mark 29. A length of shank 25 may be configured in order to limit the depth of punch mark 29. In particular, the movement of shank 25 within guide hole 21 may be limited by a bottom surface 19 of top portion 23 contacting a top surface 17 of alignment device 12. Top portion 23 thus has a larger diameter than shank 25 for that purpose as well.

Figure 3A:
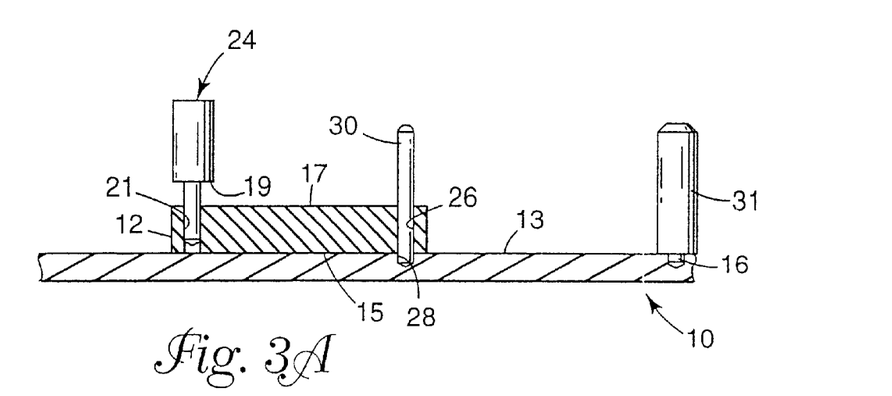
FIG. 3A is a side view of use of an alignment device to customize a nest plate while inserting a sleeved nest pin.
Figure 4:
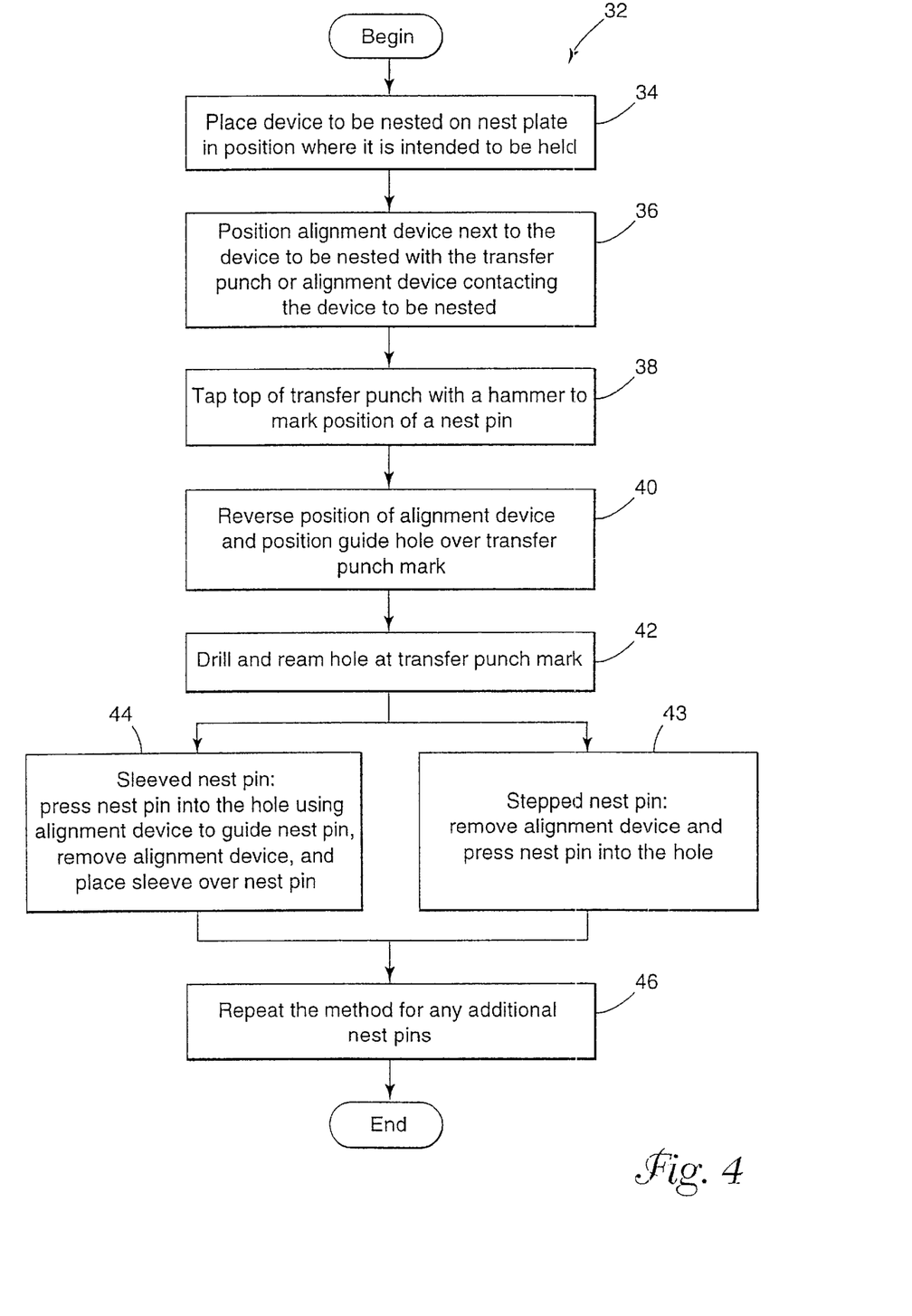
FIG. 4 is a flow chart of a method for using an alignment device to customize a nest plate.

The position of alignment device 12 is reversed and another guide hole 26 in alignment device 12 is positioned over punch mark 29 (step 40). This is shown in FIG. 3A where alignment device 12 has been reversed and guide hole 26 is positioned over a location of punch mark 29. Guide hole 21 typically has the same diameter as guide hole 26. Using guide hole 26, a hole in top surface 13 of nest plate 10 is drilled and reamed at the location of punch mark 29, shown as hole 28 (step 42).

As shown in FIG. 3A, the customized nest plate may use a sleeved nest pin. For installing a sleeved nest pin, a nest pin 30 is pressed into hole 28, using alignment device 12 to guide the nest pin through use of guide hole 26 (step 44). Guide hole 26 may have only a slightly greater diameter than the nest pin to help reduce lateral movement of the nest pin when securing it in nest plate 10. Alignment device 12 is then removed by lifting it from surface 13 of nest plate 10 and over nest pin 30 (step 44). A sleeve, such as sleeve 31 shown with nest pin 16, is then placed over nest pin 30 after alignment device 12 is removed (step 44). Sleeve 31 may be composed of a non-abrasive material, such as a molded plastic, a machined plastic, or a fiberglass reinforced epoxy laminate, to avoid scratching device 14. Sleeve 31 is typically configured having the same diameter as top portion 23 of transfer punch 24 for correct positioning of the installed pin plus sleeve. Therefore, when installed, the nest pin with the sleeve over it will contact device 14 at approximately the same position as top portion 23 of transfer punch 24, or side of alignment device 12, during the creation of punch mark 27. A sleeved nest pin includes any type or configuration of nest pin having a removable outer element.

Figure 3B:
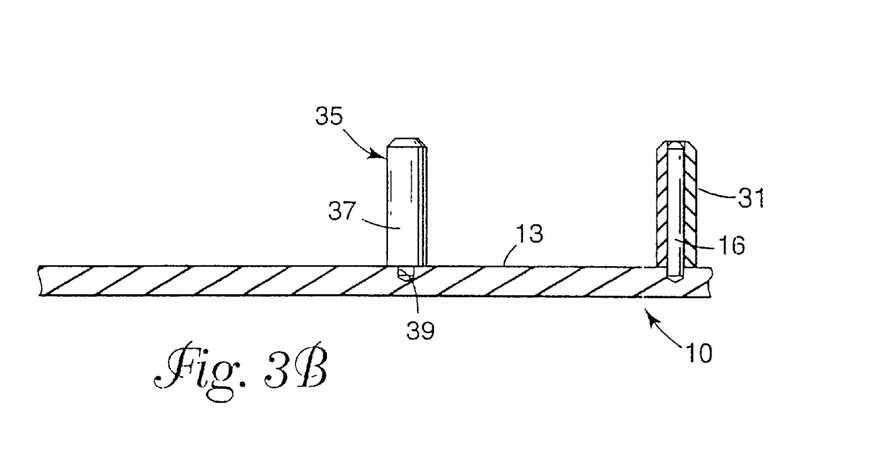
FIG. 3B is a side view of installing a stepped nest pin to customize a nest plate.

As shown in FIG. 3B, the customized nest plate may use a stepped nest pin 35 having an integral pin top portion 37 and a pin bottom portion 39. For installing a stepped nest pin, alignment device 12 is removed, after creating hole 28 in step 42, and then nest pin 35 is pressed into hole 28 (step 43). Pin top portion 37 is typically configured having the same diameter as top portion 23 of transfer punch 24 for correct positioning of the installed pin plus sleeve. Therefore, when installed, stepped nest pin 35 will contact device 14 at approximately the same position as top portion 23 of transfer punch 24, or side of alignment device 12, during the creation of punch mark 27. Stepped nest pin 35 may be composed of a non-abrasive material, such as a molded plastic, a machined plastic, or a fiberglass reinforced epoxy laminate, to avoid scratching device 14. It may be formed from, for example, one integral piece of material or multiple pieces of material joined together. A stepped nest pin includes any type or configuration of nest pin with a top portion having a larger diameter than a bottom portion. Method 32 is repeated for any additional nest pins used to securely locate device 14 to be nested (step 46).

Figure 5:
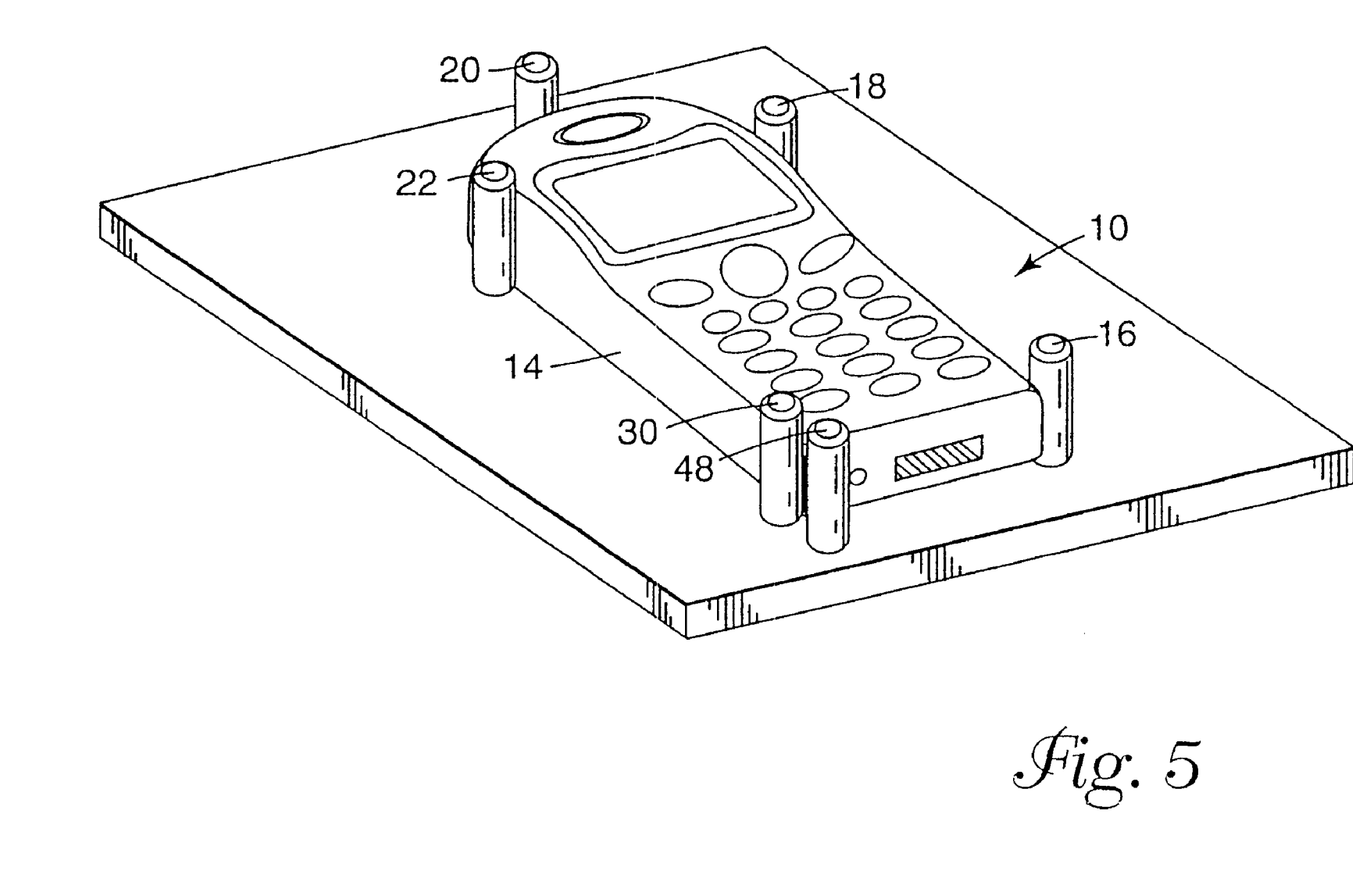
FIG. 5 is a perspective diagram illustrating a custom-made nest plate.

Upon completion of installing the nest pins, FIG. 5 illustrates customized nest plate 10 configured according to method 32 and with use of alignment device 12. As shown, device 14 is securely held through the use of nest pins 16, 18, 20, 22, 30, and 48, each of the nest pins having been installed through use of method 32 as explained above. These nest pins, once installed, securely hold device 14 in place by either contacting device 14, or closely contacting it, to hold it on a sufficient number of sides. With the nest pins in position, device 14 is held in place or easily removed from nest plate 10 by lifting it off of the nest plate. In addition, any other devices 14 having the same configuration may also be located within customized nest plate 10 with the nest pins installed. Although alignment device 12 is shown having a generally triangular shape, as shown in FIG. 1, it may be implemented with various other shapes such as a rectangular, square, round shape. In addition, the customized nest plate may use sleeved nest pins, stepped nest pins, a combination of sleeved and stepped nest pins, or other types of nest pins.

Tugboat Stop Blocks for Customizing a Nest Plate

Figure 6:
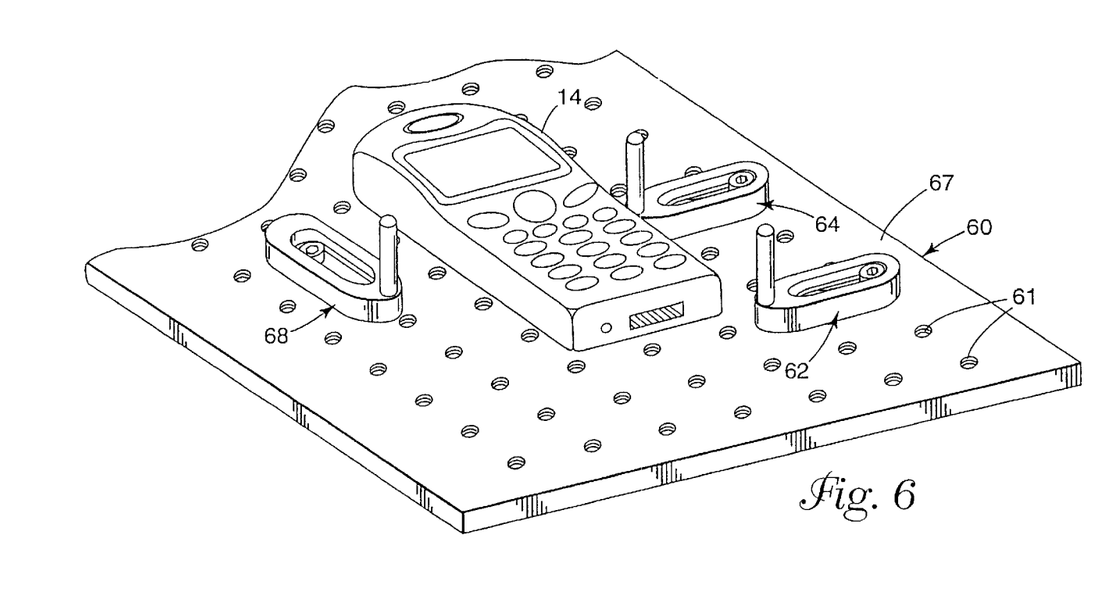
FIG. 6 is a perspective diagram of use of tugboat stop blocks to customize a nest plate.

FIG. 6 is a perspective diagram of use of tugboat stop blocks to make a customizable nest plate. As shown, a nest plate 60 having a top surface 67 includes a plurality of nest apertures 61. Located on top of surface 67 of nest plate 60 is a device to be nested 14. Device 14 is nested using a plurality of tugboat stop blocks 62, 64, and 68. Nest plate 60 may be made from, for example, aluminum or other material with threaded holes for nest apertures 61.

Figure 7:
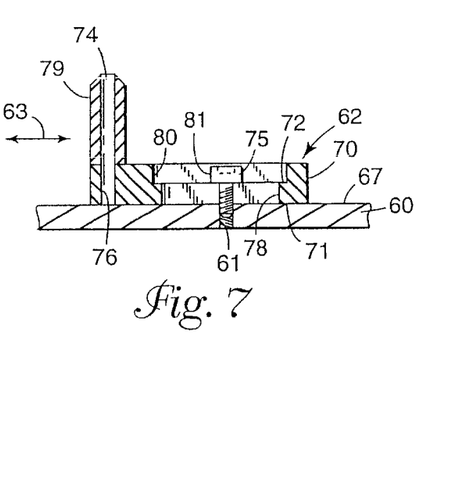
FIG. 7 is a side view of a tugboat stop block.

FIG. 7 is a side view of one of the tugboat stop blocks 62. The other tugboat stop blocks 64 and 68 may have the same configuration. Tugboat stop block 62 includes a base 70 and a vertical portion. In this example, the vertical portion includes a pin 74 securely located in base 70 through aperture 76 along with a removable plastic sleeve 79 over pin 74. Use of a plastic sleeve 79 helps to ensure that device 14 is not scratched or otherwise damaged by tugboat stop block 62. Alternatively, tugboat stop block 62 may be configured without sleeve 79.

Base 70 includes a bottom surface 71 for placement on top surface 67 of nest plate 60. Base 70 also includes an elongated aperture formed by apertures 78 and 80 joining to create a ridge 72. Therefore, by locating a fastener 75 within aperture 78 and 80, head 81 is positioned against ridge 72 such that downward force of head 81 against ridge 72 securely locates base 70 on surface 67 through friction. By loosening fastener 75, a position of tugboat stop block 62 may be changed in a lateral direction as shown by arrows 63. Fastener 75 may be implemented with, for example, a screw compatible with an Allen wrench or with other threaded or non-threaded fasteners.

Figure 8:
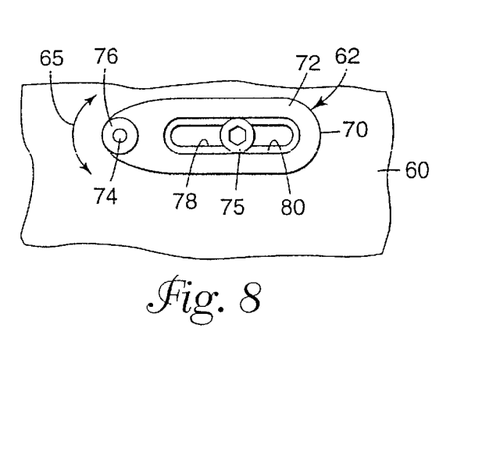
FIG. 8 is a top view of a tugboat stop block.

Once positioned, fastener 75 may again be tightened within threaded aperture 61 in order to supply sufficient pressure on ridge 72 to securely locate base 70, and hence tugboat stop block 62, on the surface 67 of nest plate 60. As shown in FIG. 8 in the top view of tugboat stop block 62, by loosening fastener 75, tugboat stop block 62 may be moved in a radial direction as shown by arrows 65 in order to position it for securely holding device 14 to be nested. Once properly positioned fastener 75 may be tightened sufficiently within threaded aperture 61 such that downward force of head 81 against ridge 72 securely holds tugboat stop block 62 in place through the use of friction between bottom surface 71 of tugboat stop block 62 and top surface 67 of nest plate 60.

Therefore, through locating and positioning each of the stop blocks, a customizable nest may be made for device 14 to be nested. In use, device 14 is securely held in place on the nest plate by being contacted on a sufficient number of sides by several tugboat stop blocks. In position, sleeve 79 of each tugboat stop block contacts, or approximately contacts, device 14 on a sufficient number of sides to hold it securely in place. Each of the tugboat stop blocks may be individually positioned and secured against device 14 one at a time, or the tugboat stop blocks may be generally positioned around device 14 and individually adjusted and secured against nest plate 60.

Although sleeve 79 and pin 74 are shown as cylindrical elements, they may have other cross-sectional shapes, such as a square or rectangular shape. In addition, base 70 is typically implemented using an alloy material, the same as for pin 74. However, base 70 may be implemented using a non-conductive material, such as a molded non-conductive plastic, a machined plastic, and a fiberglass reinforced epoxy laminate. Base 70 may be implemented with a different material than pin 74. Also, base 70 may be integrally formed with pin 74 from one piece of material, or base 70 may be a separate piece connected with pin 74. Base 70 and pin 74 may be formed or joined at a right angle, as shown in FIGS. 6 and 7, or formed at different angles; pin 74 need only extend away from base 70 when base 70 is secured to nest plate 60 so that sleeve 79 may be positioned for securing device 14. In addition, although base 70 is shown as having an elongated shape with rounded ends in a top view (FIG. 8), it may have other shapes or configurations.

Ramps for Customizing a Nest Plate

Figure 9:
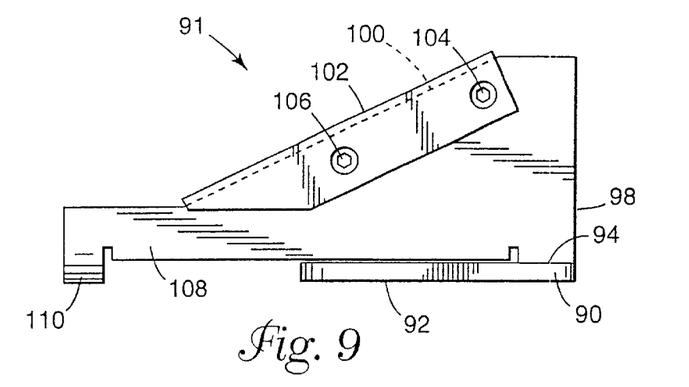
FIG. 9 is a side view of a first ramp for use in elevating a device under test above a nest plate.
Figure 10:
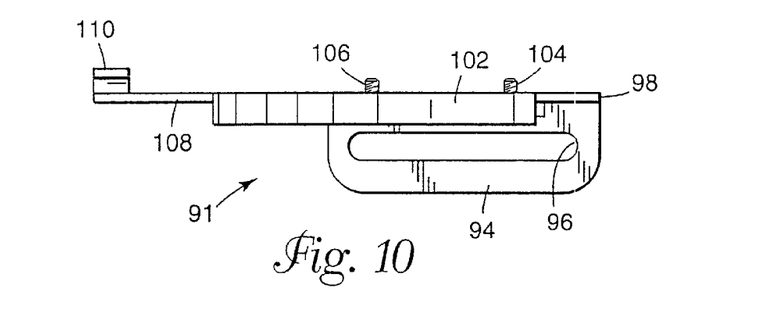
FIG. 10 is a top view of the first ramp.

FIG. 9 is a side view of the first ramp 91 for elevating a device under test above a nest plate, and FIG. 10 is a top view of ramp 91. As shown in FIGS. 9 and 10, ramp 91 includes a base 90 including a bottom surface 92 for placement against a nest plate and a top surface 94. Base 90 includes an elongated aperture 96 for receiving a fastener for adjustably attaching ramp 91 to a nest plate. The fastener may include a screw for securely fastening ramp 91 against a nest plate having multiple threaded apertures such as nest plate 60; alternatively, the fastener may be implemented with other types of threaded or non-threaded fasteners. When secured, the fastener applies pressure against top surface 94 of base 90, in the same manner that the tugboat stop block described above is fastened to a nest plate.

A vertical portion 98 of ramp 91 is attached at a right angle to base 94. Vertical portion 98 includes an adjustment portion 108 including a hook 110. Hook 110, as described below, engages with another adjustment portion 108 of another ramp 91 in order to provide for adjusting a height of a device under test above a nest plate.

A protective portion 100 is attached to vertical portion 98 using two fasteners 104 and 106, such as screws mating with threaded apertures in vertical portion 98. Other suitable types of fasteners such as rivets mating with their respective appropriate apertures may also be utilized. While vertical portion 98, base 90, and hook 110 are typically all formed of a sheet metal material, protective portion 100 typically includes a plastic or other non-abrasive material for avoiding scratching or otherwise damaging a device under test.

Figure 11:
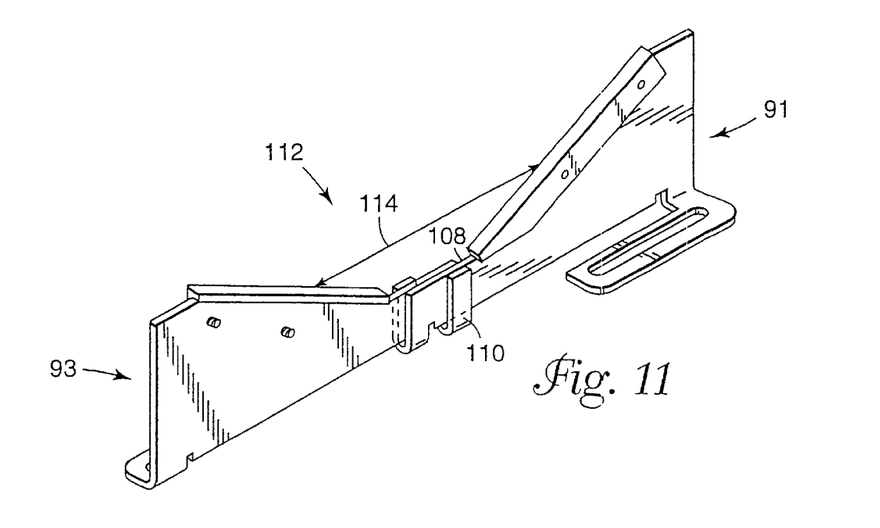
FIG. 11 is a perspective view of a pair of the first ramps illustrating how they interlock.

In operation, a pair of ramps 91 and 93 as shown in FIG. 11, each having a same configuration are joined together by adjustment portion 108 and hook 110. A device under test rests against a variable portion 102 of each protective portion 100. The ramps joined together may be adjusted by movement in either direction, as shown by arrows 114, in order to adjust a height of a device under test above a nest plate.

Figure 12:
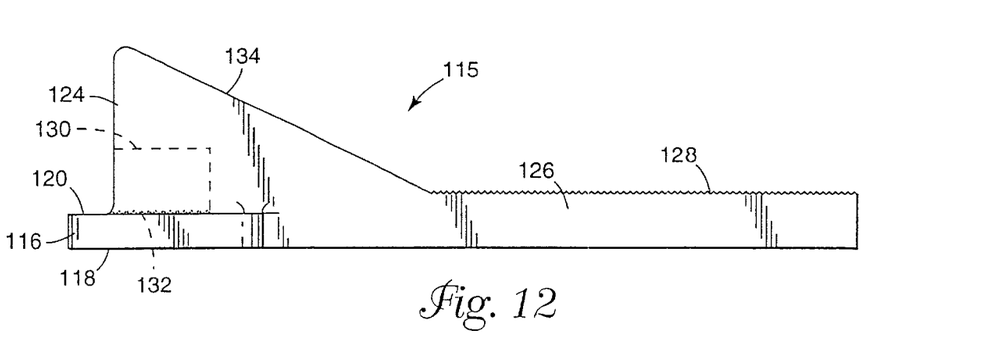
FIG. 12 is a side view of a second ramp for use in elevating a device under test above a nest plate.
Figure 13:
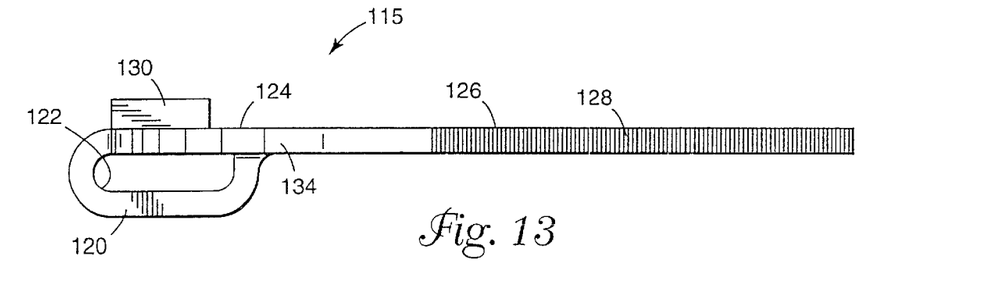
FIG. 13 is a top view of the second ramp.

FIG. 12 is a side view of a second ramp for adjusting a height of a device under test above a nest plate, and FIG. 13 is a top view of ramp 115. Ramp 115 is typically made of an one-piece molded plastic material. It includes a base 116 having a bottom surface 118 for placement against a nest plate and having a top surface 120. Base 116 includes an elongated aperture 122 for receiving a fastener for adjustably securing ramp 115 to a nest plate. For example, a threaded screw may be inserted through aperture 122 and mated with one of a plurality of threaded apertures in nest plate 61 in order to secure ramp 115 against a nest plate, in the same manner that the tugboat stop block is secured against the nest plate.

Ramp 115 includes a vertical portion 124 having an adjustment portion 126 with a ridged top surface 128. A device under test is placed against a variable portion 134 of vertical portion 124. Vertical portion 124 also includes an adjustment portion 130 having a bottom ridged surface 132.

Figure 14:
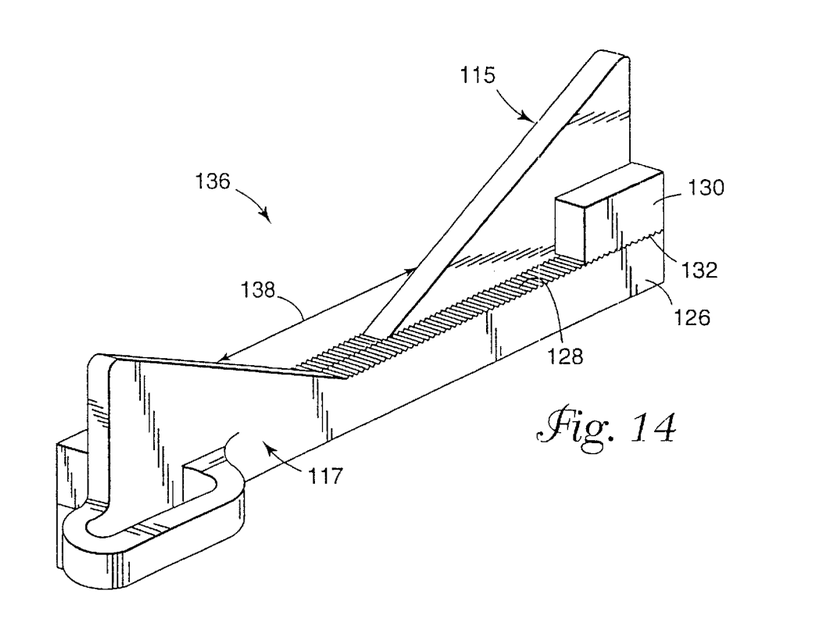
FIG. 14 is a perspective view of a pair of the second ramps illustrating how they interlock.

In operation, as shown in FIG. 14, a pair of ramps 115 and 117, each having the same configuration, are joined together through bottom ridged surface 132 of adjustment portion 130 mating with top ridged surface 128 of adjustment portion 126. The pair of ramps 115 and 117 may be moved in a direction as shown by arrows 138 in order to adjust a height of a device under test above a nest plate.

Figure 15:
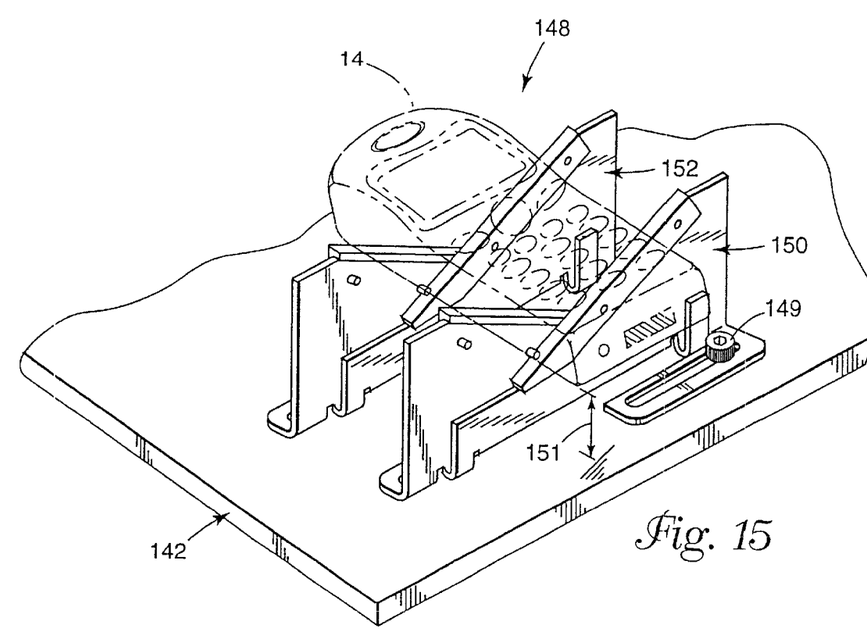
FIG. 15 is a perspective view of two pairs of the first ramps illustrating how they elevate a device under test above a nest plate.

FIG. 15 illustrates the first ramps in operation with a device under test 14. As shown in configuration 148, a first pair of ramps 115 are joined together, and a second pair of ramps 152 are also joined together, as described above, in order to uniformly adjust a height 151 of device 14 above nest plate 142. By moving each pair of ramps 150 and 152 in a direction shown by arrows 114 (see FIG. 11), device under test 14 may be raised or lowered above nest plate 142. In particular, by moving the ramps apart, the distance shown by arrows 114 becomes greater and device under test 14 has a decreasing distance 151 above nest plate 142. By moving ramps 150 and 152 closer together, the distance shown by arrows 114 decreases, increasing the distance 151 of device under test 14 above nest plate 142. Configuration 148 also illustrates a fastener 149, such as a screw, securing a ramp to nest plate 142.

Figure 16:
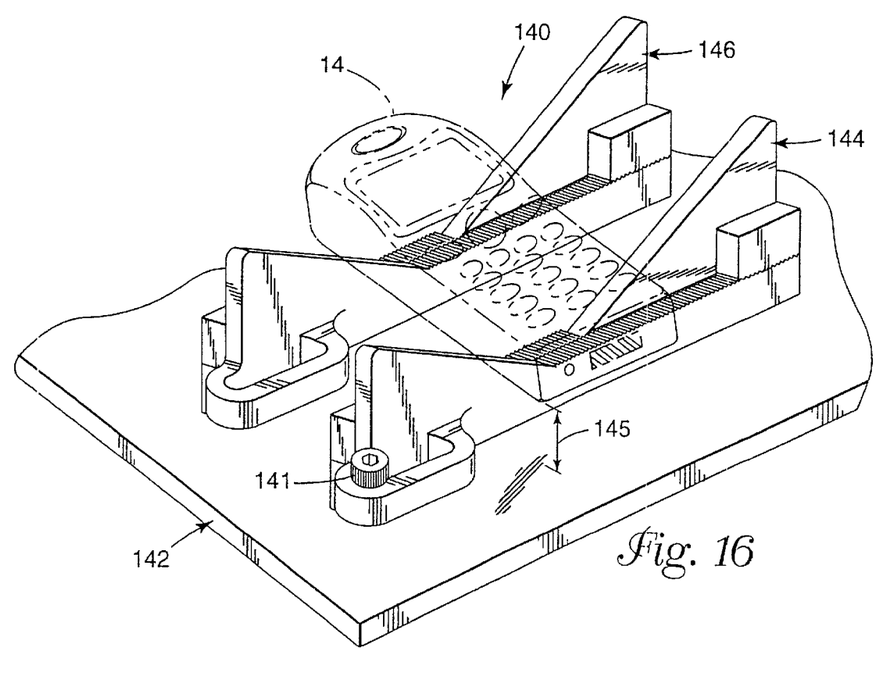
FIG. 16 is a perspective view of two pairs of the second ramps illustrating how they elevate a device under test above a nest plate.

FIG. 16 likewise illustrates operation of the second ramps. As shown in configuration 140, a first pair of the ramps 144 are joined together, and a second pair of the ramps 146 are also joined together for uniformly raising device 14 above nest plate 142. The height 145 of device 14 above nest plate 142 may also be adjusted by individually adjusting each pair of ramps 144 and 146. In particular, by moving the ramps closer together, the distance shown by arrows 138 (see FIG. 14) decreases, thus increasing height 145. By moving the ramps farther apart, the distance shown by arrows 138 increases, thus decreasing height 145. Configuration 140 also illustrates a fastener 141, such as a screw, securing a ramp to nest plate 142.

Although configurations 148 and 140 are shown with matching ramps, different types of ramps may be used for the various pairs of ramps on each nest plate. In addition, the vertical portion of the ramps may be angled at a different angle, depending for example on a configuration of the device under test. Ramps may also be used singularly, as opposed to pairs, in any position to compensate for a non-uniform shape of a device under test. The ramps may be combined with other nesting elements such as the nest pins or tugboat stop blocks described above for securely holding a device under test on a nest plate while at the same time elevating it above a nest plate. Therefore, a nest plate may be customized using any combination of nest pins, tugboat stop blocks, and types of ramps depending on a particular application.

While the present invention has been described in connection with an exemplary embodiment, it will be understood that many modifications will be readily apparent to those skilled in the art, and this application is intended to cover any adaptations or variations thereof. For example, different shapes and configurations of the nesting elements, and various types of materials for them, may be used without departing from the scope of the invention. This invention should be limited only by the claims and equivalents thereof.

What is claimed is:

1. An adjustable stop block for nesting a device under test, comprising:
   a base for placement against a nest plate having a plurality of nest apertures, the base defining an elongated aperture for use in adjustably securing the base to the nest plate using a fastener positioned in the elongated aperture and connected to one of the nest apertures;
   a vertical portion having first and second ends, the first end of the vertical portion being connected to the base and the second end of the vertical portion extending away from the nest plate when the base is secured to the one nest aperture, the vertical portion contacting the device under test when in use to nest the device, the vertical portion comprising:
   a pin attached to the base at the first end; and
   a sleeve over the pin extending from the first end to the second end, wherein the sleeve contacts the device under test when in use to nest the device.

2. The adjustable stop block of claim 1 wherein the base defines the elongated aperture with a ridge so that the fastener is recessed within the base when secured to the nest plate.

3. The adjustable stop block of claim 1 wherein the vertical portion extends from the base at a right angle.

4. The adjustable stop block of claim 1 wherein the base and the pin are composed of a metal material and the sleeve is composed of a plastic material.

5. The adjustable stop block of claim 1 wherein the elongated aperture provides for movement of the base in a lateral direction and a radial direction in order to be adjustably secured on the nest plate using the fastener.

6. A pair of first and second ramps for elevating a device under test above a nest plate, the first and second ramps each comprising:
   a base for placement against a nest plate having a plurality of nest apertures, the base defining an elongated aperture for use in adjustably securing the base to the nest plate using a fastener positioned in the elongated aperture and connected to one of the nest apertures;
   a vertical portion connected to the base, the vertical portion including a variable portion for contacting the device under test and elevating the device under test above the nest plate; and
   an adjustment portion for joining together the first and second ramps and adjusting a distance between the variable portions of the first and second ramps for use in adjusting the height of the device under test above the nest plate.

7. The pair of first and second ramps of claim 6, further including a horizontal portion extending from the vertical portion of the first ramp, and wherein the adjustment portion on the first ramp includes a hook on the horizontal portion for engaging a horizontal portion on the second ramp.

8. The pair of first and second ramps of claim 6, further including a horizontal portion on the first ramp extending from the vertical portion and having a ridged top surface, and wherein the adjustment portion on the first ramp includes a block on the vertical portion and having a ridged underside for engaging a ridged top surface on the second ramp.

9. The pair of first and second ramps of claim 6, further including a protective portion attached to the variable portion on the first and second ramps for contacting the device under test.

10. The pair of first and second ramps of claim 9 wherein the base and the vertical portion on the first and second ramps are composed of a metal material and the protective portion on the first and second ramps is composed of a plastic material.

11. The pair of first and second ramps of claim 6 wherein the base and the vertical portion on the first and second ramps are composed of an integral plastic material.

* * * * *